March 13, 1962 H. A. R. WEGENER 3,025,438

FIELD EFFECT TRANSISTOR

Filed Sept. 18, 1959

INVENTOR
HORST A. WEGENER
BY
Eyre, Mann & Lucas
ATTORNEYS

United States Patent Office 3,025,438

Patented Mar. 13, 1962

3,025,438
FIELD EFFECT TRANSISTOR

Horst A. R. Wegener, Bloomfield, N.J., assignor to Tung-Sol Electric Inc., a corporation of Delaware Filed Sept. 18, 1959, Ser. No. 840,839
5 Claims. (Cl. 317—235)

This invention relates to a field effect transistor having multiple elements surrounded by gate material. It has particular reference to a form of transistor which can be used as an amplifier and which will operate at high frequences and high power.

Many field effect transistors have been designed and made which use the pinch effect of one voltage operating to control the current in another circuit applied to a source and drain electrode. Many of these transistors were single element devices which had high impedance output circuits and very limited power. Other multiple field effect transistors have been made which include rows of semiconductor elements interspaced by control elements. These devices are limited in efficiency because they cannot handle high frequencies. Also, the amount of power is restricted because prior arrangements have not been able to dissipate the heat generated in an efficient manner. The present invention uses a plurality of small cylindrical elements, set in a matrix design and surrounded at their edges by a single layer of gate material which makes contact with the edges of all the elements. An upper and lower layer of semiconductor material is applied to the matrix to form connecting means to the elements and ohmic contacts are made to the upper and lower layers for connection to an external circuit. In this way sensitivity at high frequency is provided and because the unit is formed as a solid flat layer, sufficient heat conductivity is provided for considerable power output. Since the elements are all connected in parallel with each other the device presents a relatively low output impedance. All the elements are small cylinders and this form is well suited for high voltage amplification and operates better than any other known shape. The method of assembly makes possible a very short gate length and this feature increases the range of frequencies by a considerable amount.

One of the objects of this invention is to provide an improved field effect transistor which avoids one or more of the disadvantages and limitations of prior art arrangements.

Another object of the invention is to provide a transistor amplifier unit which will operate at high frequencies within the megacycle range.

Another object of the invention is to provide a transistor amplifier unit which can be made by a simple process to produce a multiple unit capable of high power operation.

Another object of the invention is to provide a transistor amplifier unit which has high input impedance, high sensitivity, high amplification constant, and comparatively low output impedance.

Another object of the invention is to increase the cooling means for high current semiconductor devices.

The invention includes a field effect transistor comprising a plurality of cylindrical semiconductor elements spaced apart and arranged in a matrix having one type of conductivity. The elements are surrounded by semiconductor gate material having a conductivity type differing from that of the elements. The gate material makes contact with said elements only at their edges. An upper layer of semiconductor material having the same conductivity type as the elements forms a connecting means to the upper ends of all of the elements. A similar lower layer of semiconductor material forms a connecting means to the lower ends of all of the elements. Upper and lower ohmic contact layers are provided for external connection to a source of potential and a third ohmic contact is provided for the gate material for external connection to a control circuit.

For a better understanding of the present invention, together with other and further objects thereof, reference is made to the following description taken in connection with the accompanying drawing.

Figure 1:
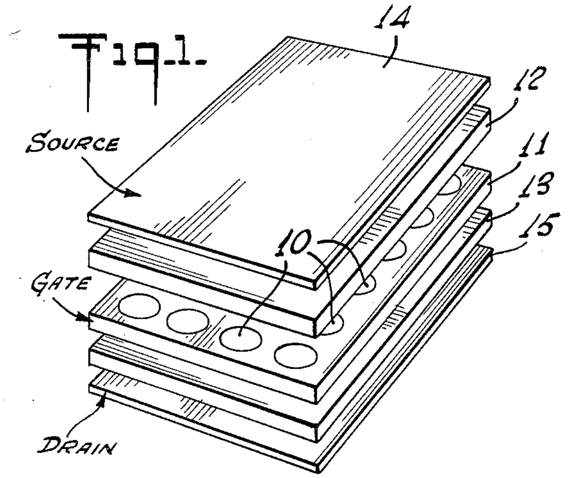
FIG. 1 is an exploded isometric view of all the components in the transistor unit.
Figures 2, 4:
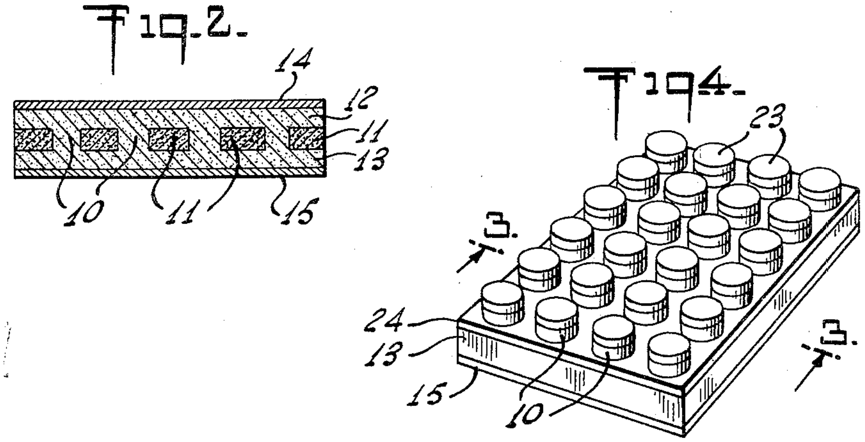
FIG. 2 is a cross sectional view showing the layers in contact.
FIG. 4 is an isometric view of a field effect transistor similar to that shown in FIGS. 1 and 2 but having no continuous top layer.

Referring now to FIGS. 1 and 2, the unit includes a plurality of semiconductor elements 10 arranged in a definite pattern, spaced apart from each other and having flat end surfaces and circular edges. These elements may be either of N or P type conductivity. The elements are surrounded at their edges by a layer of semiconductor material 11 having a conductivity type, P or N, which differs from the conductivity type of the elements 10. An upper layer 12 is formed on top of the elements and surrounding material 11 having substantially the same conductivity as the elements. A similar layer 13 is formed on the bottom of the elements and their surrounding material and these two layers 12 and 13 form a semiconductive mass interspersed by the gate material 11.

In order to connect this transistor element to an external circuit an upper ohmic contact layer 14 is provided which covers the entire upper surface of layer 12. A similar ohmic contact layer 15 is applied to layer 13, also for connection to an external circuit. As shown in FIG. 1 the upper layer 14 may be the source, the lower layer 15 may be the drain and the surrounding material 11 is the gate electrode which can be connected in an operating circuit to control the current between the source and drain.

The method of constructing this transistor element is as follows: A relatively thick slab of semiconducting material of either conductivity type is placed in a diffusion cell with a mask having a plurality of holes the size of the cylindrical elements. By the usual diffusion operation, cylindrical elements are formed in the slab having a conductivity type which differs from the type of the original slab. Diffusion may be performed from both sides of the slab. After the elements have been formed, the upper and lower layers may be deposited by vapor phase pyrolysis. The ohmic contact layers are then soldered to both sides by operations well known in the prior art.

A second method may be used to form the above described transistor. Again the start is made with a slab of material and using a mask, having holes the size of the cylindrical elements, the slab is placed in an etching solution and all the material exposed by the mask is etched away. Now, using the same mask, the element material having a different conductivity type than the original slab is filled in by evaporation. After a lapping operation, which produces smooth surfaces on each side of the mask, the upper and lower layers are provided as before by vapor phase deposition and the ohmic contact layers are added.

Figure 3:
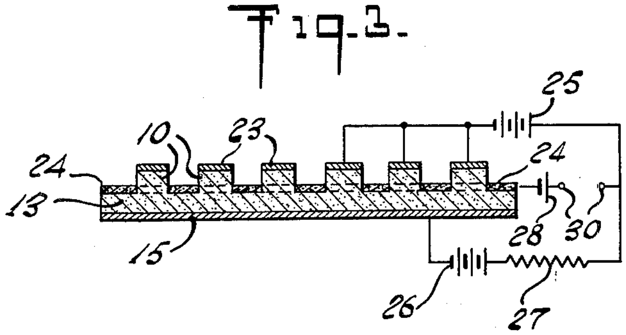
FIG. 3 is a cross sectional view of the transistor shown in FIG. 4 and is taken along line 3—3 of that figure.

The device shown in FIGS. 3 and 4 is the same as that shown in FIGS. 1 and 2 except that parts of the prior described device have been eliminated. The elements 10 are cylindrical discrete columns secured to a lower layer 13 of the same conductivity type. Only contact discs 23 are added to each of the columns 10 and these discs 23 must be connected together to form the source while the ohmic contact 15 is the drain. By the use of a mask, a different conductivity type gate material 24 is deposited adjacent to the bottom of the columns, this material is used as a gate or control to modulate the current passing from the source to the drain. Batteries 25 and 26 are in series with the load 27 and are connected directly to the source 23 and the drain 15. A bias battery 28 is connected in series with input terminals 30 where the signal is applied.

The foregoing disclosure and drawings are merely illustrative of the principles of this invention and are not to be interpreted in a limiting sense. The only limitations are to be determined from the scope of the appended claims.

I claim:

1. A field effect transistor comprising, a first flat layer of semiconductor material having an extended area, a second flat layer of semiconductor material having a similar area, said layers mounted in spaced relation with said areas parallel to each other, a plurality of cylindrical elements arranged in rows and columns and joining said first and second layers, said layers and said elements all having the same type of conductivity, said elements surrounded by semiconductor gate material having a conductivity type differing from the conductivity type of the elements and layers, an ohmic contact layer on both the first and second layers for connection to an external source of potential, and an ohmic contact on said gate material for connection to an external control circuit.

2. A field effect transistor comprising, a first flat layer of semiconductor material having an extended area, a second flat layer of semiconductor material having a similar area, said layers mounted in spaced relation with said areas parallel to each other, a plurality of cylindrical elements arranged in rows and columns spaced apart from each other and joining said first and second layers, said layers and said elements all having the same type of conductivity, said elements surrounded by semiconductor gate material having a conductivity type differing from the conductivity type of the elements and the layers, said gate material making electrical contact with the elements only at their edges, an ohmic contact layer on both the first and second layers for connection to an external source of potential, and an ohmic contact on said gate material for connection to an external control circuit.

3. A field effect transistor as set forth in claim 2 wherein the length of each of said cylindrical elements along their axes is less than their diameter.

4. A field effect transistor as set forth in claim 2 wherein the first and second layers and said elements have P-type conductivity, said elements being surrounded by gate material having an N-type conductivity.

5. A field effect transistor as set forth in claim 2 wherein the first and second layers and said elements have N-type conductivity, said elements being surrounded by gate material having P-type conductivity.

References Cited in the file of this patent

UNITED STATES PATENTS

| | | |
|---|---|---|
| 2,790,037 | Shockley | Apr. 23, 1957 |
| 2,869,054 | Tucker | Jan. 13, 1959 |